(12) United States Patent
Makino et al.

(10) Patent No.: US 9,530,628 B2
(45) Date of Patent: Dec. 27, 2016

(54) TITANIUM TARGET FOR SPUTTERING

(75) Inventors: Nobuhito Makino, Ibaraki (JP); Takeo Okabe, Ibaraki (JP); Shiro Tsukamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 461 days.

(21) Appl. No.: 14/009,537

(22) PCT Filed: Feb. 3, 2012

(86) PCT No.: PCT/JP2012/052486
§ 371 (c)(1),
(2), (4) Date: Oct. 3, 2013

(87) PCT Pub. No.: WO2013/027425
PCT Pub. Date: Feb. 28, 2013

(65) Prior Publication Data
US 2014/0027277 A1 Jan. 30, 2014

(30) Foreign Application Priority Data
Aug. 23, 2011 (JP) ................. 2011-181444

(51) Int. Cl.
*H01J 37/34* (2006.01)
*C23C 14/34* (2006.01)
*C22C 14/00* (2006.01)
*C22F 1/18* (2006.01)

(52) U.S. Cl.
CPC ........... *H01J 37/3426* (2013.01); *C22C 14/00* (2013.01); *C22F 1/183* (2013.01); *C23C 14/3407* (2013.01); *H01J 37/3429* (2013.01); *C23C 14/3414* (2013.01)

(58) Field of Classification Search
CPC ...... C23C 14/3414; C23C 14/14; C22C 14/00; C22F 1/183; H01J 37/3426; H01J 37/3429
See application file for complete search history.

(56) References Cited

U.S. PATENT DOCUMENTS

| 5,993,621 | A | 11/1999 | Liu |
|---|---|---|---|
| 6,210,502 | B1 | 4/2001 | Takahashi |
| 6,755,948 | B1 | 6/2004 | Fukuyo et al. |
| 8,663,440 | B2 | 3/2014 | Tsukamoto et al. |
| 9,068,258 | B2 | 6/2015 | Tsukamoto et al. |
| 2012/0073964 | A1 | 3/2012 | Tsukamoto et al. |
| 2013/0186753 | A1 | 7/2013 | Tsukamoto et al. |
| 2014/0251802 | A1 | 9/2014 | Tsukamoto et al. |
| 2015/0021174 | A1 | 1/2015 | Yagi et al. |
| 2016/0005576 | A1 | 1/2016 | Tsukamoto |

FOREIGN PATENT DOCUMENTS

| JP | 08-232061 A | 9/1996 |
|---|---|---|
| JP | 09-049074 A | 2/1997 |
| JP | 10-008245 A | 1/1998 |
| JP | 10-317073 A | 12/1998 |
| JP | 2003-253411 A | 9/2003 |
| JP | 2010-235998 A | 10/2010 |

*Primary Examiner* — Michael Band
(74) *Attorney, Agent, or Firm* — Howson & Howson, LLP

(57) ABSTRACT

A high-purity titanium target for sputtering, which contains, as additive components, one or more elements selected from Al, Si, S, Cl, Cr, Fe, Ni, As, Zr, Sn, Sb, B, and La in a total amount of 3 to 100 mass ppm, and of which the purity excluding additive components and gas components is 99.99 mass % or higher. An object of this invention is to provide a high-quality titanium target for sputtering, which is free from fractures and cracks during high-power sputtering (high-rate sputtering) and capable of stabilizing the sputtering characteristics.

16 Claims, No Drawings

TITANIUM TARGET FOR SPUTTERING

BACKGROUND

The present invention relates to a high-quality titanium target for sputtering, which is free from the generation of fractures and cracks during high-power sputtering (high-rate sputtering) and capable of stabilizing the sputtering characteristics.

The impurity concentration described in the present specification will be displayed in mass parts per million (mass ppm) in all cases.

In recent years, various electronic devices have been devised beginning with the breakthrough of semiconductors, and the improvement of the performance thereof as well as the development of new devices are being sought on a daily basis.

Under these circumstances, there is a tendency to miniaturization of electronic devices and equipment and to increase in the degree of integration thereof. Numerous thin films are formed during the manufacturing process of many of such devices and equipment, and titanium, from its unique metallic property, is used in the formation of thin films of various electronic devices as a titanium or its alloy film, a titanium silicide film, a titanium nitride film, or the like.

Generally speaking, the aforementioned films such as a titanium or its alloy film, a titanium silicide film and a titanium nitride film can be formed with a physical deposition method such as sputtering or vacuum deposition. Explained below is the sputtering method which is used most comprehensively among the above.

This sputtering method is a method of physically colliding positive ions such as $Ar^+$ to a target disposed on a cathode and discharging the metal atoms configuring the target with the collision energy thereof. Nitrides can be formed by using titanium or its alloy (TiAl alloy, etc.) as the target and conducting sputtering under a mixed gas atmosphere of argon gas and nitrogen.

In recent years, in order to improve the production efficiency, there are demands for high-rate sputtering (high-power sputtering). Here, there are cases where the target is subject to fractures or cracks, and these problems tend to prevent stable sputtering. Patent Document 1 and Patent Document 2 listed below are cited as prior art documents.
[Patent Document 1] International Publication No. WO01/038598
[Patent Document 2] Published Japanese Translation No. 2001-509548 of PCT Application

SUMMARY OF INVENTION

Technical Problem

The present invention was devised in order to resolve the various problems described above. Thus, an object of this invention is to provide a high-quality titanium target for sputtering, which is free from fractures and cracks during high-power sputtering (high-rate sputtering) and capable of stabilizing the sputtering characteristics.

Solution to Problem

The present invention provides: 1) a high-purity titanium target for sputtering, which contains, as additive components, one or more elements selected from Al, Si, S, Cl, Cr, Fe, Ni, As, Zr, Sn, Sb, B, and La in a total amount of 3 to 100 mass ppm, and of which the purity excluding additive components and gas components is 99.99 mass % or higher.

The present invention additionally provides: 2) the titanium target for sputtering according to 1) above, wherein the purity excluding additive components and gas components is 99.995 mass % or higher; 3) the titanium target for sputtering according to 1) above, wherein the purity excluding additive components and gas components is 99.999 mass % or higher; 4) the titanium target for sputtering according to any one of 1) to 3) above, wherein the average crystal grain size of the target is 30 μm or less; 5) the titanium target for sputtering according to any one of 1) to 4) above, wherein the average crystal grain size of the target prior to performing sputtering is 30 μm or less, and the average crystal grain size after starting the sputtering process is 70 μm or less; and 6) the titanium target for sputtering according to any one of 1) to 5) above, wherein a 0.2% proof stress of the titanium target upon being heated to 500° C. is 36 $N/mm^2$ or more.

Effects of Invention

The titanium target for sputtering of the present invention yields a superior effect in that it is free from fractures and cracks even during high-power sputtering (high-rate sputtering) and capable of stabilizing the sputtering characteristics and forming a high-quality film.

DETAILED DESCRIPTION

The titanium target for sputtering of the present invention is a high-purity titanium target with a purity of 99.99 mass % or higher, and more preferably 99.995 mass % or higher. It goes without saying that the purity of the foregoing titanium target excludes additive components and gas components.

Generally speaking, a certain level of gas components such as oxygen, nitrogen and hydrogen get included in greater amounts in comparison to other impurity elements. While the amount of inclusion of these gas components is desirably small, an amount that is normally included will not be particularly harmful in achieving the object of the present invention.

The inclusion of one or more elements selected from Al, Si, S, Cl, Cr, Fe, Ni, As, Zr, Sn, Sb, B, and La as additive components in a total amount of 3 to 100 mass ppm is a significant feature of the present invention. By adding foregoing elements, the average crystal grain size of the target can be made to be 30 μm or less at the stage of producing the target.

Moreover, the target is heated to approximately 700° C. during the sputtering process, but the addition of one or more elements selected from Al, Si, S, Cl, Cr, Fe, Ni, As, Zr, Sn, Sb, B, and La also inhibits the coarsening of the crystal grain size caused by the heating process. Specifically, it is possible to maintain an average crystal grain size of 70 μm or less even upon being subject to this kind of high-temperature heat; that is, the average crystal grain size of the target can be maintained to be 70 μm or less even upon being subject to this kind of heat treatment after the sputtering starts.

While the crystal grain size of the target tends to become slightly coarse due to the thermal effect after the sputtering process is started, it could be said that the target is hardly subject to the thermal effect.

Heat during the sputtering also affects the crystal plane orientation. Nevertheless, the addition of one or more elements selected from Al, Si, S, Cl, Cr, Fe, Ni, As, Zr, Sn, Sb, B, and La described above yields the effect of being able to effectively inhibit changes in the crystal plane orientation. Changes in the crystal plane orientation is undesirable since it will affect the deposition rate and film quality, and the inhibition of changes in the crystal plane orientation yields the effect of being able to maintain constant deposition quality.

Moreover, as shown in the Examples described later, the strength of the target is high, and the strength is still high even when subject to the thermal effect. This yields a significant effect of being able to inhibit the generation of fractures and cracks in the target.

While the foregoing additive elements are preferably added in a total amount of 3 to 100 mass ppm, there are preferable ranges upon individually and independently adding these elements as listed below. Nevertheless, the addition of these elements is not limited to such independent addition, and independent additions and multiple additions are both recommended depending on the used material or purpose.

Al: 1 ppm to 100 ppm
Si: 0.3 ppm to 100 ppm
S: 1 ppm to 100 ppm
Cl: 0.2 ppm to 100 ppm
Cr: 0.5 ppm to 100 ppm
Fe: 10 ppm to 100 ppm
Ni: 1 ppm to 100 ppm
As: 1 ppm to 100 ppm
Zr: 0.2 ppm to 100 ppm
Sn: 1 ppm to 100 ppm
Sb: 1 ppm to 100 ppm
B: 0.5 ppm to 100 ppm
La: 0.1 ppm to 100 ppm A target with high strength which also shows high strength even when subject to the thermal effect yields the effect of being able to inhibit the generation of fractures and cracks in the target. In addition, this phenomenon yields the effect of being able to inhibit the generation of fractures and cracks in the target not only in the target before starting the sputtering process, but also in the target that is subject to the high-temperature thermal effect of 700° C. during the sputtering process.

In addition, since the crystal orientation is stabilized, it is possible to obtain stable sputtering characteristics, and this is effective to realize uniform deposition.

Moreover, since the target has high strength and shows high strength even upon being subject to the thermal effect, it is possible to reduce the stress on the target surface due to the warping during sputtering or the thermal stress or thermal fatigue caused by the ON/OFF of the sputtering power, and it is thereby possible to effectively prevent the target from cracking.

The foregoing effects can be achieved as a result of the titanium target itself being high purity and containing, as additive components, one or more elements selected from Al, Si, S, Cl, Cr, Fe, Ni, As, Zr, Sn, Sb, B, and La in a total amount of 3 to 100 mass ppm, and these numerical ranges show the range that the effectiveness of the present invention can be realized.

The object of the present invention cannot be achieved if it is less than the lower limit and the characteristics as a high-purity target will be impaired and an excess amount of elements become impurities if it exceeds the upper limit. Thus, the foregoing range is used.

In order to manufacture high-purity titanium, the well-known molten salt electrolysis may be used. The atmosphere is preferably an inert atmosphere. During electrolysis, the initial cathode current density is set to 0.6 A/cm$^2$ or less as the lower current density. Moreover, the electrolytic temperature is preferably set to 600 to 800° C.

The electrodeposited Ti obtained as described above and the foregoing additive elements; namely, one or more elements selected from Al, Si, S, Cl, Cr, Fe, Ni, As, Zr, Sn, Sb, B, and La, are mixed in a predetermined amount and subject to EB (electron beam) melting, this is subject to cold solidification to prepare an ingot, and the ingot is subject to hot deformation work such as hot forging or hot extrusion at 800 to 950° C. to prepare a billet. The uneven and coarsened cast structure of the ingot can be destroyed through the foregoing process to achieve a uniform and fine structure.

Cold plastic deformation such as cold forging or cold extrusion is repeatedly performed to the billet obtained as described above to apply high strain to the billet, and the crystal structure of the target is ultimately made to be a uniform fine structure of 30 μm or less.

Subsequently, the billet is cut to prepare a preform corresponding to the target volume. Cold plastic working such as cold forging or cold extrusion is additionally performed to the preform to apply high stress, and this is processed into a disk-shaped target.

In addition, the target comprising a processed structure accumulated with high strain is subject to a rapid temperature rise using a fluid bed furnace or the like, and heat treatment is performed for a short period of time at 400 to 500° C. It is thereby possible to obtain a target having a fine recrystallized structure of 30 μm or less.

With the titanium target of the present invention obtained as described above, the 0.2% proof stress upon heating the target to 500° C. becomes 36 N/mm$^2$ or more, and the 0.2% proof stress at a high temperature is high, and an effect of being able to inhibit the generation of cracks and fractures even during high-power sputtering (high-rate sputtering) is yielded.

The foregoing manufacturing processes show an example of a method for obtaining the high-purity titanium target of the present invention, and the present invention is not limited to the foregoing manufacturing processes so as long as it is possible to obtain a titanium target for sputtering, in which one or more elements selected from Al, Si, S, Cl, Cr, Fe, Ni, As, Zr, Sn, Sb, B, and La are contained in a total amount of 3 to 100 mass ppm and the remainder is titanium and unavoidable impurities, and of which the purity excluding additive components and gas components is 99.99 mass % or higher.

EXAMPLES

Examples of the present invention are now explained. Note that these Examples are merely exemplifications and the present invention shall not be limited thereto. Specifically, the present invention covers all modes or modifications other than the Examples included in the scope of technical concept of the present invention.

Example 1

Additive elements that can be selected in the present invention were added as follows in a total amount of 52 mass ppm to Ti with a purity of 99.995 mass %; specifically, Al: 4.3 mass ppm (indication of mass is omitted below), Si: 0.5 ppm, S: 0.1 ppm, Cl: 0.1 ppm, Cr: 0.9 ppm, Fe: 15 ppm, Ni:

15 ppm, As: 8.6 ppm, Zr: 0.2 ppm, Sn: 4.8 ppm, Sb: 1.3 ppm, B: 1.1 ppm, and La: 0.1 ppm. A list of additive components is indicated in Table 10.

Example 2

Additive elements that can be selected in the present invention were added as follows in a total amount of 43 mass ppm to Ti with a purity of 99.995 mass %; specifically, Al: 4.7 mass ppm (indication of mass is omitted below), Si: 0.4 ppm, S: 0.1 ppm, Cl: 0.1 ppm, Cr: 1.4 ppm, Fe: 13 ppm, Ni: 10 ppm, As: 6.8 ppm, Zr: 0.2 ppm, Sn: 4 ppm, Sb: 1.1 ppm, B: 1.1 ppm, and La: 0.1 ppm. A list of additive components is indicated in Table 10.

Example 3

Additive elements that can be selected in the present invention were added as follows in a total amount of 7.2 mass ppm to Ti with a purity of 99.995 mass %; specifically, Al: 1.6 mass ppm (indication of mass is omitted below), Si: 0.2 ppm, S: 4.3 ppm, Cl: 0 ppm, Cr: 0.3 ppm, Fe: 0.6 ppm, Ni: 0 ppm, As: 0 ppm, Zr: 0.1 ppm, Sn: 0.1 ppm, Sb: 0 ppm, B: 0 ppm, and La: 0 ppm. A list of additive components is indicated in Table 10.

Example 4

Additive elements that can be selected in the present invention were added as follows in a total amount of 71 mass ppm to Ti with a purity of 99.995 mass %; specifically, Al: 7.4 mass ppm (indication of mass is omitted below), Si: 0.8 ppm, S: 0.8 ppm, Cl: 0.3 ppm, Cr: 1.1 ppm, Fe: 18 ppm, Ni: 19 ppm, As: 10.3 ppm, Zr: 0.3 ppm, Sn: 9.4 ppm, Sb: 2.4 ppm, B: 1.1 ppm, and La: 0.1 ppm. A list of additive components is indicated in Table 10.

Example 5

Additive elements that can be selected in the present invention were added as follows in a total amount of 94 mass ppm to Ti with a purity of 99.995 mass %; specifically, Al: 11.3 mass ppm (indication of mass is omitted below), Si: 0.5 ppm, S: 2.1 ppm, Cl: 0.5 ppm, Cr: 0.9 ppm, Fe: 24 ppm, Ni: 21 ppm, As: 14.7 ppm, Zr: 0.2 ppm, Sn: 14.3 ppm, Sb: 2.9 ppm, B: 1.5 ppm, and La: 0.1 ppm. A list of additive components is indicated in Table 10.

Comparative Example 1

Additive elements were added as follows in a total amount of 2.5 mass ppm to Ti with a purity of 99.995 mass %; specifically, Al: 0.7 mass ppm (indication of mass is omitted below), Si: 0.3 ppm, S: 0 ppm, Cl: 0.1 ppm, Cr: 0.1 ppm, Fe: 0.1 ppm, Ni: 0.9 ppm, As: 0 ppm, Zr: 0.1 ppm, Sn: 0.1 ppm, Sb: 0.1 ppm, B: 0 ppm, and La: 0 ppm.

Note that, in order to facilitate the comparison with the Examples, elements that were not added are also indicated in the list as 0 ppm. As described above, Comparative Example 1 fails to satisfy the condition in the present invention that the lower limit of additive elements is 3 mass ppm. A list of additive components is indicated in Table 10.

Ti doped with the elements shown in foregoing Examples 1 to 5 and Comparative Example 1 was subject to electron beam melting, the production conditions previously discussed for producing an ingot were used as needed to prepare a Ti ingot, and this was processed into a target shape.

The obtained target was heated to 550° C. and 700° C. and the growth of the crystal grains was observed. Results of the crystal grain size at the time of target preparation and the crystal grain size after the heating process are shown in Table 1.

With respect to Examples 1 to 5 and Comparative Example 1, at the stage of preparing the target, the crystal grain sizes were 5 μm, 5 μm, 5 μm, 5 μm, 5 μm, and 8 μm, respectively, and each case had fine crystals of 30 μm or less.

At the stage of producing the Ti ingot of the present invention, since there is segregation of components at the top part and the bottom part, componential analysis of both parts was performed regarding Example 1. The results are shown in Table 2 and Table 3. Table 2 is about the top part and Table 3 is about the bottom part.

In the foregoing case, the results for both the top part and the bottom part were within the scope of additive components of the present invention even though there are differences with respect to the additive components. If there is a considerable difference between the top part and the bottom part, it goes without saying that the portion to be acquired from the ingot can be suitably selected (by eliminating the inappropriate area) for usage.

TABLE 1

|  | GS at the time of target preparation | GS at the time of heating target to 550° C. | GS at the time of heating target to 700° C. |
| --- | --- | --- | --- |
| Example 1 | 5 | 8 | 33 |
| Example 2 | 5 | 7 | 28 |
| Example 3 | 5 | 7 | 45 |
| Example 4 | 5 | 8 | 37 |
| Example 5 | 5 | 8 | 40 |
| Comprative Example 1 | 8 | 32 | 195 |

GS: (average crystal grain size: μm)

TABLE 2

| TOP Element | Concentration [ppm wt] |  | [ppm wt] |
| --- | --- | --- | --- |
| Li | <0.005 | Ag | <0.02 |
| Be | <0.005 | Cd | <0.05 |
| B | 1.3 | In | <0.05 |
| F | <0.05 | Sn | 4.7 |
| Na | <0.01 | Sb | 1.2 |
| Mg | <0.01 | Te | <0.05 |
| Al | 4.4 | I | <0.01 |
| Si | 0.69 | Cs | <0.01 |
| P | <0.01 | Ba | <0.005 |
| S | 0.12 | La | 0.13 |
| Cl | <0.01 | Ce | <0.005 |
| K | <0.01 | Pr | <0.005 |
| Ca | <1 | Nd | <0.005 |
| Sc | <0.05 | Sm | <0.005 |
| Ti | Matrix | Eu | <0.005 |
| V | 0.026 | Gd | <0.005 |
| Cr | 0.94 | Tb | <0.005 |
| Mn | <0.005 | Dy | <0.005 |
| Fe | 19 | Ho | <0.005 |
| Co | 0.057 | Er | <0.005 |
| Ni | 18 | Tm | <0.005 |
| Cu | <0.05 | Yb | <0.005 |
| Zn | <0.05 | Lu | <0.005 |
| Ga | <0.05 | Hf | 0.06 |
| Ge | <0.05 | Ta | <5 |
| As | 10 | W | <0.01 |
| Se | <0.05 | Re | <0.01 |
| Br | <0.05 | Os | <0.01 |
| Rb | <5 | Ir | <0.01 |
| Sr | <3000 | Pt | <0.05 |

TABLE 2-continued

| TOP Element | Concentration [ppm wt] | | [ppm wt] |
|---|---|---|---|
| Y | <200 | Au | <0.05 |
| Zr | 0.22 | Hg | <0.1 |
| Nb | <0.2 | Tl | <0.01 |
| Mo | <0.05 | Pb | <0.01 |
| Ru | <0.01 | Bi | <0.01 |
| Rh | <0.05 | Th | <0.0001 |
| Pd | <0.01 | U | <0.0001 |

TABLE 3

| BTM Element | Concentration [ppm wt] | | [ppm wt] |
|---|---|---|---|
| Li | <0.005 | Ag | <0.02 |
| Be | <0.005 | Cd | <0.005 |
| B | 0.85 | In | <0.05 |
| F | <0.05 | Sn | 4.8 |
| Na | <0.01 | Sb | 1.4 |
| Mg | 0.11 | Te | <0.05 |
| Al | 4.1 | I | <0.01 |
| Si | 0.35 | Cs | <0.01 |
| P | <0.01 | Ba | <0.005 |
| S | 0.04 | La | 0.14 |
| Cl | 0.12 | Ce | <0.005 |
| K | <0.01 | Pr | <0.005 |
| Ca | <1 | Nd | <0.005 |
| Sc | <0.05 | Sm | <0.005 |
| Ti | Matrix | Eu | <0.005 |
| V | 0.032 | Gd | <0.005 |
| Cr | 0.8 | Tb | <0.005 |
| Mn | 0.068 | Dy | <0.005 |
| Fe | 11 | Ho | <0.005 |
| Co | 0.06 | Er | <0.005 |
| Ni | 11 | Tm | <0.005 |
| Cu | <0.05 | Yb | <0.005 |
| Zn | <0.05 | Lu | <0.005 |
| Ga | <0.05 | Hf | 0.08 |
| Ge | <0.05 | Ta | <5 |
| As | 7.1 | W | <0.01 |
| Se | <0.05 | Re | <0.01 |
| Br | <0.05 | Os | <0.01 |
| Rb | <5 | Ir | <0.01 |
| Sr | <3000 | Pt | <0.05 |
| Y | <200 | Au | <0.05 |
| Zr | 0.21 | Hg | <0.1 |
| Nb | <0.2 | Tl | <0.01 |
| Mo | <0.05 | Pb | <0.01 |
| Ru | <0.01 | Bi | <0.01 |
| Rh | <0.05 | Th | <0.0001 |
| Pd | <0.01 | U | <0.0001 |

(Transition of Average Crystal Grain Size in Examples 1 to 5 and Comparative Example 1)

As shown in Table 1, while Examples 1 to 5 slightly coarsened at the stage of being heated to 550° C., there was hardly any change. Even when heated to 700° C., the maximum coarsening was up to 45 μm, and no coarsening that exceeded 70 μm could be observed.

Meanwhile, while Comparative Example 1 had fine crystals of 30 μm or less during the target preparation, it coarsened to 32 μm at the stage of being heated to 550° C., and further coarsened to 195 μm when it was heated to 700° C.

Subsequently, the crystal orientation that appears in the target was examined in respective Examples 1 to 5 and Comparative Example 1. The results are shown in Table 4 and Table 5. Table 4 shows the Basal plane orientation ratio, and Table 5 shows the (002) plane orientation ratio.

The Basal plane orientation ratio was calculated based on the formula shown in Table 6, and the (002) orientation ratio was calculated based on the formula shown in Table 7.

TABLE 4

| | Orientation Ratio at the time of target preparation | Orientation Ratio at the time of heating target to 550° C. | Orientation Ratio at the time of heating target to 700° C. |
|---|---|---|---|
| Example 1 | 72 | 75 | 77 |
| Example 2 | 73 | 70 | 74 |
| Example 3 | 74 | 71 | 76 |
| Example 4 | 72 | 75 | 77 |
| Example 5 | 71 | 76 | 78 |
| Comprative Example 1 | 61 | 72 | 75 |

Orientation Ratio: Basal plane orientation ratio (%)

TABLE 5

| | Orientation Ratio at the time of target preparation | Orientation Ratio at the time of heating target to 550° C. | Orientation Ratio at the time of heating target to 700° C. |
|---|---|---|---|
| Example 1 | 2 | 4 | 1 |
| Example 2 | 1 | 3 | 2 |
| Example 3 | 2 | 3 | 2 |
| Example 4 | 2 | 4 | 1 |
| Example 5 | 3 | 5 | 1 |
| Comprative Example 1 | 7 | 27 | 63 |

Orientation Ratio: (002) plane orientation ratio (%)

TABLE 6

$$\left(\begin{array}{c}\text{Occupancy Raito A of}\\ \text{the Crystal Orientations}\end{array}\right) \equiv \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\sum \frac{I_{(hkl)}}{R_{(hkl)}}}$$

$$\sum \frac{I_{(hkl)}}{R_{(hkl)}} \equiv \frac{I_{(010)}}{R_{(010)}} + \frac{I_{(002)}}{R_{(002)}} + \frac{I_{(011)}}{R_{(011)}} + \frac{I_{(012)}}{R_{(012)}} + \frac{I_{(110)}}{R_{(110)}} +$$

$$\frac{I_{(103)}}{R_{(103)}} + \frac{I_{(200)}}{R_{(200)}} + \frac{I_{(112)}}{R_{(112)}} + \frac{I_{(201)}}{R_{(201)}} + \frac{I_{(004)}}{R_{(004)}} +$$

$$\frac{I_{(202)}}{R_{(202)}} + \frac{I_{(014)}}{R_{(014)}} + \frac{I_{(203)}}{R_{(203)}} + \frac{I_{(211)}}{R_{(211)}} + \frac{I_{(114)}}{R_{(114)}} +$$

$$\frac{I_{(212)}}{R_{(212)}} + \frac{I_{(015)}}{R_{(015)}} + \frac{I_{(204)}}{R_{(204)}} + \frac{I_{(300)}}{R_{(300)}} + \frac{I_{(213)}}{R_{(213)}} + \frac{I_{(302)}}{R_{(302)}}$$

($I_{(hkl)}$ means a peak intensity of a (hkl) plane measured by a X-ray diffraction method, and $R_{(hkl)}$ means a relative intensity ratio (refer to JCPDS Card) of the (hkl) plane.)

TABLE 7

$$\left(\begin{array}{c}\text{Occupancy Raito B of}\\ \text{the Crystal Orientation}\end{array}\right) \equiv \frac{\frac{I_{(002)}}{R_{(002)}}}{\sum \frac{I_{(hkl)}}{R_{(hkl)}}}$$

$$\sum \frac{I_{(hkl)}}{R_{(hkl)}} \equiv \frac{I_{(010)}}{R_{(010)}} + \frac{I_{(002)}}{R_{(002)}} + \frac{I_{(011)}}{R_{(011)}} + \frac{I_{(012)}}{R_{(012)}} + \frac{I_{(110)}}{R_{(110)}} +$$

$$\frac{I_{(103)}}{R_{(103)}} + \frac{I_{(200)}}{R_{(200)}} + \frac{I_{(112)}}{R_{(112)}} + \frac{I_{(201)}}{R_{(201)}} + \frac{I_{(004)}}{R_{(004)}} +$$

$$\frac{I_{(202)}}{R_{(202)}} + \frac{I_{(014)}}{R_{(014)}} + \frac{I_{(203)}}{R_{(203)}} + \frac{I_{(211)}}{R_{(211)}} + \frac{I_{(114)}}{R_{(114)}} +$$

$$\frac{I_{(212)}}{R_{(212)}} + \frac{I_{(015)}}{R_{(015)}} + \frac{I_{(204)}}{R_{(204)}} + \frac{I_{(300)}}{R_{(300)}} + \frac{I_{(213)}}{R_{(213)}} + \frac{I_{(302)}}{R_{(302)}}$$

($I_{(hkl)}$ means a peak intensity of a (hkl) plane measured by a X-ray diffraction method, and $R_{(hkl)}$ means a relative intensity ratio (refer to JCPDS Card) of the (hkl) plane.)

As shown in Table 4, with respect to the Basal plane orientation ratio of Examples 1 to 5, the orientation ratio upon preparation of the target was within the range of 71 to 74%, within the range of 70 to 76% when heated to 550° C., and within the range of 74 to 78% when heated to 700° C. Accordingly, the Basal plane orientation ratio did not fluctuate significantly.

Meanwhile, while the Basal plane orientation ratio of Comparative Example 1 was in the range of 61% upon preparation of the target, it became 72% when heated to 550° C. and considerably increased to 75% when heated to 700° C., and the Basal plane orientation ratio increased.

As evident from the above, it has been confirmed that the Examples show a smaller change in the Basal plane orientation ratio in comparison to the Comparative Example.

As shown in Table 5, with respect to the (002) plane orientation ratio of Examples 1 to 5, the orientation ratio upon preparation of the target was within the range of 1 to 3%, within the range of 3 to 5% when heated to 550° C., and within the range of 1 to 2% when heated to 700° C. Accordingly, the (002) plane orientation ratio did not fluctuate significantly.

Meanwhile, while the (002) plane orientation ratio of Comparative Example 1 was in the range of 7% upon preparation of the target, it became 27% when heated to 550° C. and considerably increased to 63% when heated to 700° C.

As evident from the above, it has been confirmed that the Examples show a smaller change in the (002) plane orientation ratio in comparison to the Comparative Example.

Subsequently, Table 8 shows, regarding the various Ti targets of foregoing Examples 1 to 5 and Comparative Example 1, the 0.2% proof stress when the average crystal grain size upon the preparation of the target of the present invention is 5 μm, and the 0.2% proof stress when the average crystal grain size upon the preparation of the target of the Comparative Example is 8 μm. Moreover, the 0.2% proof stress when the various Ti targets of foregoing Examples 1 to 5 and Comparative Example 1 are heated to 500° C. is shown in Table 9.

TABLE 8

|  | GS at the time of target preparation | 0.2% proof stress (N/mm$^2$) |
|---|---|---|
| Example 1 | 5 | 285 |
| Example 2 | 5 | 270 |
| Example 3 | 5 | 220 |
| Example 4 | 5 | 289 |
| Example 5 | 5 | 291 |
| Comprative Example 1 | 8 | 134 |

GS: (average crystal grain size: μm)

TABLE 9

|  | 0.2% proof stress (N/mm$^2$) |
|---|---|
| Example 1 | 49 |
| Example 2 | 55 |
| Example 3 | 36 |
| Example 4 | 51 |
| Example 5 | 54 |
| Comprative Example 1 | 18 |

Proof stress when heated at 500° C.

TABLE 10

| | Component Composition | | | | | | | | | | | | | |
|---|---|---|---|---|---|---|---|---|---|---|---|---|---|---|
|  | Al | Si | S | Cl | Cr | Fe | Ni | As | Zr | Sn | Sb | B | La | Total |
| Example 1 | 4.3 | 0.5 | 0.1 | 0.1 | 0.9 | 15 | 15 | 8.6 | 0.2 | 4.8 | 1.3 | 1.1 | 0.1 | 52 |
| Example 2 | 4.7 | 0.4 | 0.1 | 0.1 | 1.4 | 13 | 10 | 6.8 | 0.2 | 4 | 1.1 | 1.1 | 0.1 | 43 |
| Example 3 | 1.6 | 0.2 | 4.3 | 0 | 0.3 | 0.6 | 0 | 0 | 0.1 | 0.1 | 0 | 0 | 0 | 7.2 |
| Example 4 | 7.4 | 0.8 | 0.8 | 0.3 | 1.1 | 18 | 19 | 10.3 | 0.3 | 9.4 | 2.4 | 1.1 | 0.1 | 71 |
| Example 5 | 11.3 | 0.5 | 2.1 | 0.5 | 0.9 | 24 | 21 | 14.7 | 0.2 | 14.3 | 2.9 | 1.5 | 0.1 | 94 |
| Comparative Example 1 | 0.7 | 0.3 | 0 | 0.1 | 0.1 | 0.1 | 0.9 | 0 | 0.1 | 0.1 | 0.1 | 0 | 0 | 2.5 | mass ppm

As shown in Table 8, while the 0.2% proof stress of Examples 1 to 5 of the present application is high at 220 to 291 N/mm$^2$, it does not change significantly depending on the types of additive elements. Moreover, the 0.2% proof stress of Comparative Example 1 is slightly low at 134 N/mm$^2$.

Accordingly, as with the present invention, a titanium target for sputtering, which contains, as additive components, one or more elements selected from Al, Si, S, Cl, Cr, Fe, Ni, As, Zr, Sn, Sb, B, and La in a total amount of 3 to 100 mass ppm, and of which the purity excluding additive components and gas components is 99.99 mass % or higher yields a significant effect of being free from the generation of fractures and cracks.

Test pieces were prepared from titanium that was prepared in Example 1, Example 2, Example 3, Example 4 and Example 5, heated to 500° C., and subject to a tension test to measure the 0.2% proof stress. The test pieces were measured at the following three points; namely, center, ½ R, and outer periphery.

The high-temperature tension test conditions were as follows.
Test piece shape: JIS shape (G 0567II-6)
Test method: In accordance with JIS G 0567
  Tester: 100 kN high-temperature tension tester
  Temperature: 500° C.
  Gauge length: 30 mm
  Test rate: displacement control at 0.3%/min; 7.5%/min after the proof stress
  Rate of temperature increase: 45° C./min
  Holding time at 500° C.: 15 minutes
  Temperature measuring method: the center of a test piece is fixed to thermocouple Consequently, the average values of the 0.2% proof stress were 49 N/mm$^2$ in Example 1, 55 N/mm$^2$ in Example 2, 36 N/mm$^2$ in Example 3, 51 N/mm$^2$ in Example 4, and 54 N/mm$^2$ in Example 5, respectively, and all Examples satisfied the condition of the 0.2% proof stress being 36 N/mm$^2$ or more. Accordingly, since these have a high 0.2% proof stress at a high temperature, cracks and fractures could be effectively inhibited even during high-power sputtering (high-rate sputtering).

Note that, while heating up to 700° C. is anticipated in high-power sputtering, only the outermost layer of the target exposed to plasma is the layer that reaches the foregoing temperature. Heating an entire sample to 700° C. in the tension test is a harsh condition relative to the actual working conditions of the target, and it could be said that testing at 500° C. is closer to the actual working conditions.

Meanwhile, in Comparative Example 1, a test piece was prepared from titanium that was prepared in the same manner as described above, heated to 500° C., and subject to a tension test to measure the 0.2% proof stress. Similarly, the test piece was measured at the following three points; namely, center, ½ R, and outer periphery.

Consequently, the average value of the 0.2% proof stress in Comparative Example 1 was 18 N/mm$^2$, and failed to achieve the condition of the present invention of the 0.2% proof stress being 36 N/mm$^2$ or more. In addition, the inhibition of cracks and fractures during high-power sputtering (high-rate sputtering) was inferior in comparison to the Examples.

Since the present invention is able to provide a high-quality titanium target for sputtering, which is free from fractures and cracks during high-power sputtering (high-rate sputtering) and capable of stabilizing the sputtering characteristics, the present invention is useful in forming thin films for electronic devices and the like.

The invention claimed is:

1. A high-purity titanium target for sputtering, which contains, as additive components, one or more elements selected from the group consisting of Al, Si, S, Cl, Cr, Fe, Ni, As, Zr, Sn, Sb, B, and La in a total amount of 3 to 100 mass ppm, wherein addition amounts of the additive components include 1 to 100 mass ppm for Al, 0.2 to 100 mass ppm for Si, 0 to 100 mass ppm for Cl, 0.3 to 100 mass ppm for Cr, more than 10 to 100 mass ppm for Fe, 1 to 100 mass ppm for Ni, and 0.1 to 100 mass ppm for Sn, and wherein a purity of the target excluding the additive components and gas components is 99.99 mass % or higher.

2. The titanium target for sputtering according to claim 1, wherein the purity excluding the additive components and gas components is 99.995 mass % or higher.

3. The titanium target for sputtering according to claim 1, wherein the purity excluding the additive components and gas components is 99.999 mass % or higher.

4. The titanium target for sputtering according to claim 3, wherein the titanium target has an average crystal grain size of 30 μm or less.

5. The titanium target for sputtering according to claim 4, wherein the average crystal grain size being 30 μm or less before sputtering and is 70 μm or less after being subject to heat generated during sputtering.

6. The titanium target for sputtering according to claim 4, wherein a 0.2% proof stress of the titanium target upon being heated to 500° C. is 36 N/mm$^2$ or more.

7. The titanium target for sputtering according to claim 1, wherein the titanium target has an average crystal grain size of 30 μm or less.

8. The titanium target for sputtering according to claim 1, wherein the titanium target has an average crystal grain size of 30 μm or less before sputtering.

9. The titanium target for sputtering according to claim 1, wherein the titanium target has an average crystal grain size of 70 μm or less after being subject to heat generated during sputtering.

10. The titanium target for sputtering according to claim 1, wherein a 0.2% proof stress of the titanium target is 36 N/mm$^2$.

11. The titanium target for sputtering according to claim 3, wherein the titanium target has an average crystal grain size of 30 μm or less as manufactured before being subject to heat generated during sputtering and wherein, after the titanium target has been heated to 700° C. during sputtering, the average crystal grain size is 70 μm or less.

12. The titanium target for sputtering according to claim 11, wherein after the titanium target has been heated to 700° C. during sputtering, the average crystal grain size is within a range of 28 to 40 μm.

13. The titanium target for sputtering according to claim 11, wherein a 0.2% proof stress of the titanium target upon being heated to 500° C. is within a range of 49 to 55 N/mm$^2$.

14. The titanium target for sputtering according to claim 1, wherein, after having been subjected to heat of 700° C. generated during sputtering, the titanium target has an average crystal grain size within a range of 70 μm or less.

15. The titanium target for sputtering according to claim 1, wherein, after having been subjected to heat of 700° C. generated during sputtering, the titanium target has an average crystal grain size within a range of 28 to 40 μm.

16. The titanium target for sputtering according to claim 1, wherein a 0.2% proof stress of the titanium target upon being heated to 500° C. is within a range of 49 to 55 N/mm$^2$.

* * * * *